(12) United States Patent
Shimizu et al.

(10) Patent No.: US 9,288,910 B2
(45) Date of Patent: Mar. 15, 2016

(54) SUBSTRATE WITH BUILT-IN ELECTRONIC COMPONENT AND METHOD FOR MANUFACTURING SUBSTRATE WITH BUILT-IN ELECTRONIC COMPONENT

(71) Applicant: IBIDEN CO., LTD., Ogaki-shi (JP)

(72) Inventors: Keisuke Shimizu, Ogaki (JP); Yuichi Nakamura, Ogaki (JP); Tsuyoshi Yamaguchi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/555,856

(22) Filed: Nov. 28, 2014

(65) Prior Publication Data

US 2015/0156881 A1 Jun. 4, 2015

(30) Foreign Application Priority Data

Nov. 29, 2013 (JP) ................. 2013-247216

(51) Int. Cl.
| | |
|---|---|
| *H05K 1/18* | (2006.01) |
| *H05K 3/30* | (2006.01) |
| *H01L 23/13* | (2006.01) |
| *H01L 23/498* | (2006.01) |
| *H01L 23/538* | (2006.01) |
| *H05K 3/46* | (2006.01) |

(52) U.S. Cl.
CPC ............... *H05K 1/183* (2013.01); *H01L 23/13* (2013.01); *H01L 23/49822* (2013.01); *H01L 23/49827* (2013.01); *H01L 23/5389* (2013.01); *H05K 1/185* (2013.01); *H05K 3/30* (2013.01); *H05K 1/181* (2013.01); *H05K 3/4602* (2013.01); *H05K 2201/096* (2013.01); *H05K 2201/10674* (2013.01); *Y10T 29/4913* (2015.01)

(58) Field of Classification Search
CPC ....... H05K 1/183; H05K 1/185; H05K 1/186; H05K 1/187; H05K 1/188; H05K 3/30
See application file for complete search history.

(56) References Cited

U.S. PATENT DOCUMENTS 7,786,390 B2 8/2010 Ikeda

FOREIGN PATENT DOCUMENTS

JP 2012-191204 A 10/2012

*Primary Examiner* — Jeremy C Norris
(74) *Attorney, Agent, or Firm* — Oblon, McClelland, Maier & Neustadt, L.L.P.

(57) ABSTRACT

A substrate with a built-in electronic component includes multiple resin insulating layers including first, second, third and fourth insulating layers, multiple conductor layers including a first wiring layer including a first pad, a second wiring layer including a second pad, and a third wiring layer including third and fourth pads, multiple via conductors including a first via connecting the first and second pads through the second insulating layer, a second via connecting the second and third pads through the third and fourth insulating layers, and a third via connected to the fourth pad through the fourth insulating layer, and an electronic component positioned a cavity through the second and third insulating layers such that the third via is connecting terminal of the component and fourth pad. The second and third vias have filled plating filling opening portions through the third and fourth insulating layers and through the fourth insulating layer.

20 Claims, 11 Drawing Sheets ers formed through the second resin insulating layer and connecting the first conductor pad and the second conductor pad, a second via conductor formed through the third and fourth resin insulating layers and connecting the second conductor pad and the third conductor pad, and a third via conductor formed through the fourth resin insulating layer and connected to the fourth conductor pad, and an electronic component having a terminal and positioned a cavity formed through the second resin insulating layer and the third resin insulating layer such that the third via conductor is connecting the terminal of the electronic component and the fourth conductor pad formed on the fourth resin insulating layer. The second via conductor has filled plating filling an opening portion formed through the third and fourth resin insulating layers, and the third via conductor has filled plating filling an opening portion formed through the fourth resin insulating layer.

SUBSTRATE WITH BUILT-IN ELECTRONIC COMPONENT AND METHOD FOR MANUFACTURING SUBSTRATE WITH BUILT-IN ELECTRONIC COMPONENT

CROSS-REFERENCE TO RELATED APPLICATIONS

The present application is based upon and claims the benefit of priority to Japanese Patent Application No. 2013-247216, filed Nov. 29, 2013, the entire contents of which are incorporated herein by reference

BACKGROUND OF THE INVENTION

1. Field of the Invention

The present invention relates to a substrate with a built-in electronic component and a method for manufacturing the substrate with the built-in electronic component in which an electronic component is installed in a cavity provided to a resin insulating layer.

2. Description of Background Art

Japanese Patent Laid-open Publication No. 2012-191204 describes a printed circuit board having a semiconductor element embedded in an insulating layer. In Japanese Patent Laid-open Publication No. 2012-191204, a cavity accommodating the electronic component is formed by laminating a resin insulating layer on top of a support conductor wiring layer on which an electronic component is positioned; cutting a slit reaching the support conductor wiring layer into the laminated resin insulating layer with a laser; and removing the sliced resin insulation layer. The entire contents of this publication are incorporated herein by reference.

SUMMARY OF THE INVENTION

According to one aspect of the present invention, a substrate with a built-in electronic component includes multiple resin insulating layers including a first resin insulating layer, a second resin insulating layer laminated on the first resin insulating layer, a third resin insulating layer laminated on the second resin insulating layer, and a fourth resin insulating layer laminated on the third resin insulating layer, multiple conductor layers including a first conductor wiring layer formed on the first resin insulating layer and including a first conductor pad, a second conductor wiring layer formed on the second resin insulating layer and including a second conductor pad, and a third conductor wiring layer formed on the fourth resin insulating layer and including a third conductor pad and a fourth conductor pad, multiple a first via conductor formed through the second resin insulating layer and connect- According to another aspect of the present invention, a method for manufacturing a substrate with a built-in electronic component including forming a first conductor wiring layer on a first resin insulating layer such that the first conductor wiring layer includes a first conductor pad and a support conductor wiring layer formed to position an electronic component, laminating a second resin insulating layer on the first resin insulating layer and the first conductor wiring layer, forming a first via conductor through the second resin insulating layer such that the first via conductor reaches the first conductor pad, forming a second conductor wiring layer on the second resin insulating layer such that the second conductor wiring layer includes a second conductor pad connected to the first via conductor on the second resin insulating layer, laminating a third resin insulating layer on the second resin insulating layer and the second conductor wiring layer, irradiating laser upon the third resin insulating layer such that a cavity is formed through the third resin insulating layer and the second resin insulating layer and exposes a portion of the support conductor wiring layer, positioning the electronic component on the portion of the support conductor wiring layer in the cavity, laminating a fourth resin insulating layer on the third resin insulating layer and the electronic component, forming a second via opening through the third resin insulating layer and the fourth resin insulating layer such that the second via opening reaches the second conductor pad, forming a third via opening through the fourth resin insulating layer such that the third via opening reaches a terminal of the electronic component, and plating the second via opening and the third via opening such that a second via conductor having filled plating is formed in the second via opening and a third via conductor having filled plating is formed in the third via opening.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
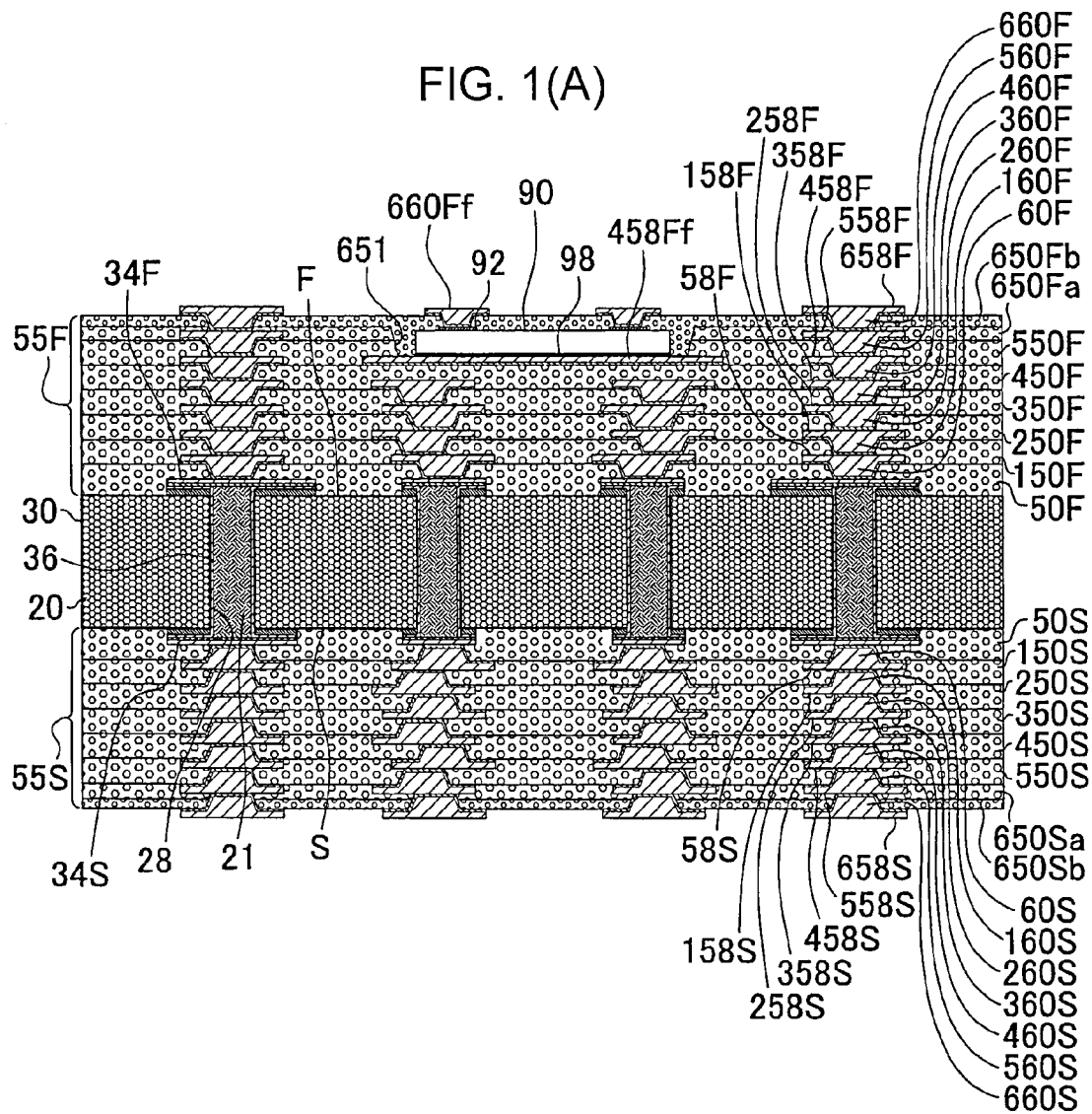
FIG. 1(A) is a cross-sectional view of a substrate with a built-in electronic component according to a first embodiment of the present invention.

The embodiments will now be described with reference to the accompanying drawings, wherein like reference numerals designate corresponding or identical elements throughout the various drawings.

First Embodiment

FIG. 1(A) shows a cross-sectional view of a substrate with a built-in electronic component according to a first embodiment. A substrate with a built-in electronic component 10 according to the first embodiment includes a core substrate 30. The core substrate 30 includes an insulating substrate 20 having a first surface (F) and a second surface (S) on a side opposite the first surface; a first surface-side conductor wiring layer (34F) formed on the first surface (F) of the insulating substrate 20; and a second surface-side conductor wiring layer (34S) formed on the second surface of the insulating substrate 20. The core substrate 30 further includes a through-hole conductor 36 connecting the first surface-side conductor wiring layer (34F) and the second surface-side conductor wiring layer (34S). The through-hole conductor 36 is formed on an inner wall of a through-hole 28 penetrating through the core substrate 30, and an interior of the through-hole conductor 36 is filled with a fill resin 21. The core substrate 30 shown in FIG. 1(A) may be manufactured by a method described in U.S. Pat. No. 7,786,390, for example. The entire contents of this publication are incorporated herein by reference. The first surface-side conductor wiring layer (34F) and the second surface-side conductor wiring layer (34S) of the core substrate 30 include multiple conductor circuits not shown in the drawings and a through-hole land formed around the through-hole conductor 36. The first surface of the substrate with the built-in electronic component and the core substrate 30 and the first surface of the core substrate 30 are the same surface, while the second surface of the substrate with the built-in electronic component and the core substrate 30 and the second surface of the core substrate 30 are the same surface. In this example, the through-hole conductor has a cylindrical shape; however, the shape of the through-hole and the shape of the through-hole conductor may also be hourglass-shaped such that openings of each taper toward a center and connect at a central portion, the openings of each having openings on a front surface of each of the first surface (F) and the second surface (S) of the core substrate 30.

An upper build-up layer (55F) is formed on the first surface (F) of the core substrate 30. The build-up layer (55F) has a resin insulating layer (50F) formed on top of the core substrate and on top of the first surface-side conductor wiring layer (34F). A conductor wiring layer (58F) is formed on top of the resin insulating layer (50F). The conductor wiring layer (58F) and the first surface-side conductor wiring layer (34F) are connected by a via conductor (60F) penetrating through the resin insulating layer (50F). A resin insulating layer (150F) is formed on top of the resin insulating layer (50F). A conductor wiring layer (158F) is formed on top of the resin insulating layer (150F). The conductor wiring layer (158F) and the conductor wiring layer (58F) are connected by a via conductor (160F) penetrating through the resin insulating layer (150F). A resin insulating layer (250F) is formed on top of the resin insulating layer (150F). A conductor wiring layer (258F) is formed on top of the resin insulating layer (250F). The conductor wiring layer (258F) and the conductor wiring layer (158F) are connected by a via conductor (260F) penetrating through the resin insulating layer (250F). Similarly, moreover, four layers formed of a resin insulating layer (350F), a first resin insulating layer (450F), a second resin insulating layer (550F), and an outermost resin insulating layer (650F); a conductor wiring layer (358F), a first conductor wiring layer (458F), a second conductor wiring layer (558F), and a third conductor wiring layer (658F); and a via conductor (360F), a via conductor (460F), a first via conductor (560F), and a second via conductor (660F) are further formed, such that the upper build-up layer (55F) is configured by seven build-up layers.

A lower build-up layer (55S) is formed on the second surface (S) of the core substrate 30. The build-up layer (55S) has a resin insulating layer (50S) formed on top of the core substrate and on top of the second surface-side conductor wiring layer (34S). A conductor wiring layer (58S) is formed on the resin insulating layer (50S). The conductor wiring layer (58S) and the second surface-side conductor wiring layer (34S) are connected by a via conductor (60S) penetrating through the resin insulating layer (50S). A resin insulating layer (150S) is formed on top of the resin insulating layer (50S). A conductor wiring layer (158S) is formed on top of the resin insulating layer (150S). The conductor wiring layer (158S) and the conductor wiring layer (58S) are connected by a via conductor (160S) penetrating through the resin insulating layer (150S). A resin insulating layer (250S) is formed on top of the resin insulating layer (150S). A conductor wiring layer (258S) is formed on the resin insulating layer (250S). The conductor wiring layer (258S) and the conductor wiring layer (158S) are connected by a via conductor (260S) penetrating through the resin insulating layer (250S). Similarly, moreover, four layers formed of a resin insulating layer (350S), a first resin insulating layer (450S), a second resin insulating layer (550S), and an outermost resin insulating layer (650S); a conductor wiring layer (358S), a first conductor wiring layer (458S), a second conductor wiring layer (558S), and a third conductor wiring layer (658S); and a via conductor (360S), a via conductor (460S), a first via conductor (560S), and a second via conductor (660S) are further formed, such that the lower build-up layer (55S) is configured by seven build-up layers.

Figure 1B:
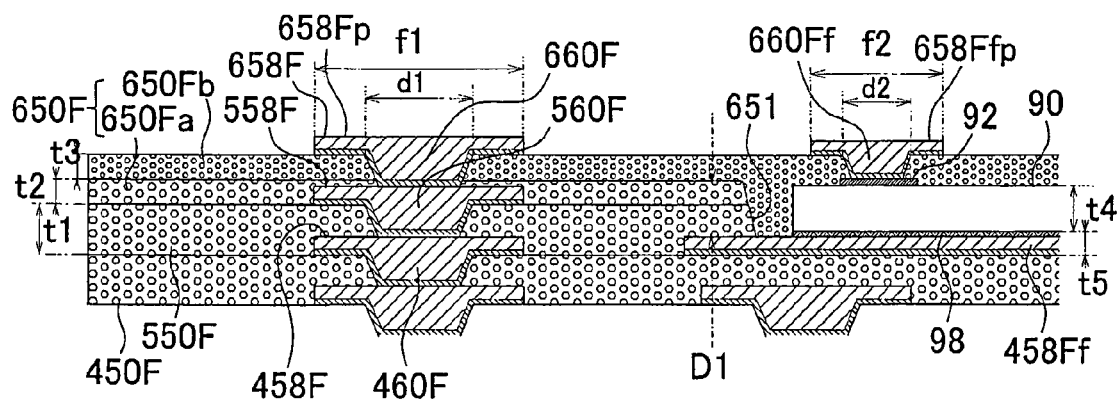
FIG. 1(B) is a partial expanded view of FIG. 1(A)

FIG. 1(B) shows an expanded view of the outermost resin insulating layer (650F), in which an electronic component 90 is installed, and the second resin insulating layer (550F), which touches the outermost resin insulating layer, as shown in FIG. 1.

The electronic component 90 is an IC chip such as a CPU, memory, or the like, and includes a rewiring layer on a surface layer. Although an active component is accommodated in the present example, an electronic component configured by a passive component such as a chip capacitor or resistor can also be accommodated.

The outermost resin insulating layer (650F) has a two-layer structure that includes a third resin insulating layer (650Fa) and a fourth resin insulating layer (650Fb). The cavity 651 is formed in the second resin insulating layer (550F) and the third resin insulating layer (650Fa), and the electronic component 90 is accommodated in the cavity. The support conductor wiring layer (458Ff) supporting the electronic component is formed on the first resin insulating layer (450F) below the second resin insulating layer (550F). The electronic component 90 is arranged on top of the support conductor wiring layer (458Ff) with an adhesive 98 interposed therebetween. The fourth resin insulating layer (650Fb) is coated on top of the electronic component 90, a terminal (pad) 92 of the electronic component 90 and a fourth conductor pad (658Ffp) on the fourth resin insulating layer (650Fb) are connected by a third via conductor (660Ff) penetrating through the fourth resin insulating layer (650Fb). The second conductor wiring layer (558F) and the outermost third conductor wiring layer (658F) are connected by the second via conductor (660F) penetrating through the outermost resin insulating layer (650F). A thickness (t1) of the second resin insulating layer is 30 μm, a thickness (t2) of the third resin insulating layer is 10 μm, and a thickness (t3) of the fourth resin insulating layer is 20 μm. A thickness (t4) of the electronic component 90 is 35 μm and is substantially equal to adding the thickness Op of the second resin insulating layer to the thickness (t2) of the third resin insulating layer, then subtracting a thickness (t5) (5 μm) of the support conductor wiring layer (458Ff), including the adhesive 98. Specifically, a depth (D1) of the cavity 651 is substantially equal to the thickness (t4) of the electronic component 90.

A maximum diameter (d1) of the second via conductor (660F) penetrating through the outermost resin insulating layer (650F) is larger than a maximum diameter (d2) of the third via conductor (660Ff) penetrating through the fourth resin insulating layer (650Fb). A diameter (f1) of the third conductor pad (658Fp) connected to the second via conductor (660F) is greater than a diameter (f2) of the fourth conductor pad (658Ffp) connected to the third via conductor (660Ff).

Figure 9A:
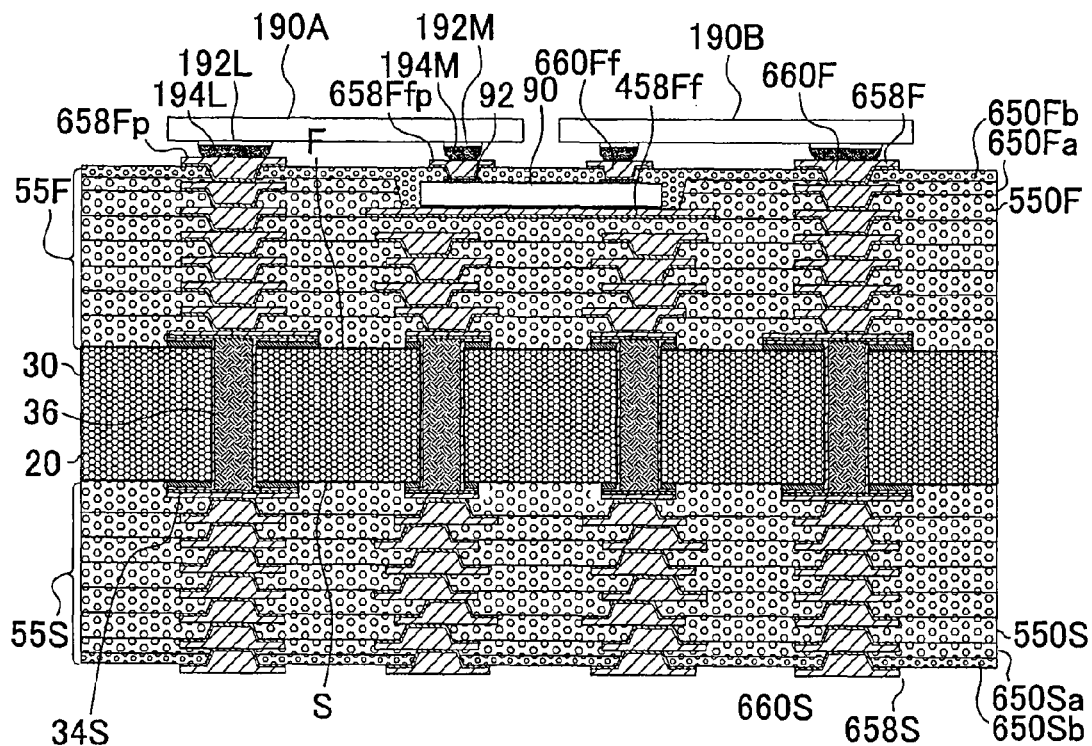
FIG. 9(A) illustrates a cross-sectional view of an exemplary application of the substrate with the built-in electronic component according to the first embodiment.
Figure 9B:
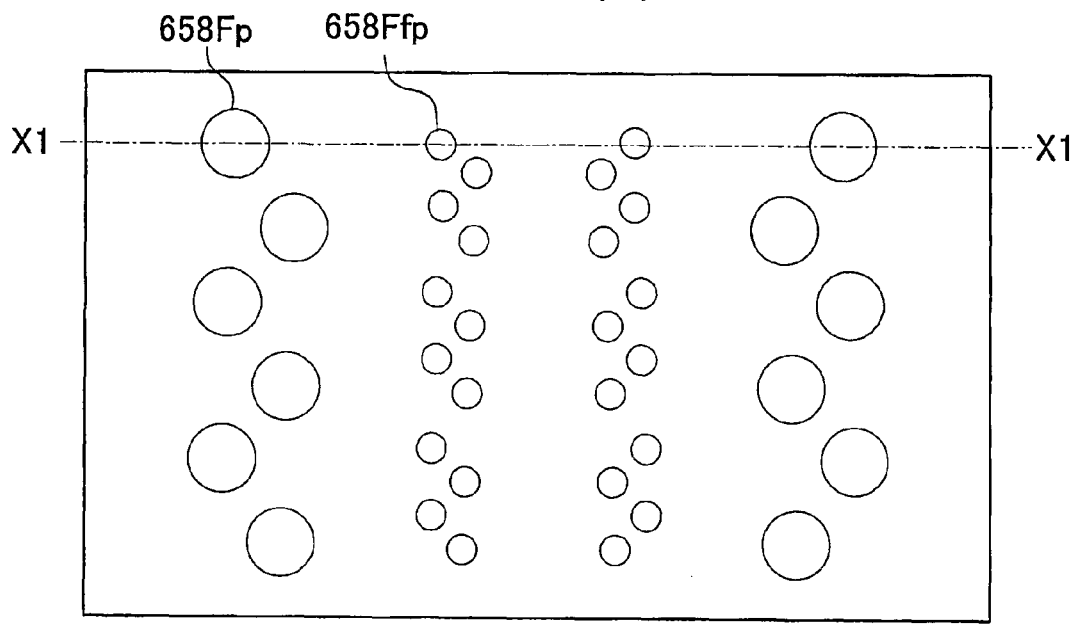
FIG. 9(B) is a plan view of the substrate with the built-in electronic component.

FIG. 9(B) is a plan view of the substrate with the built-in electronic component shown in FIG. 1(A). A cross-section X1-X1 in FIG. 9(B) corresponds to FIG. 1(A).

Figure 10:
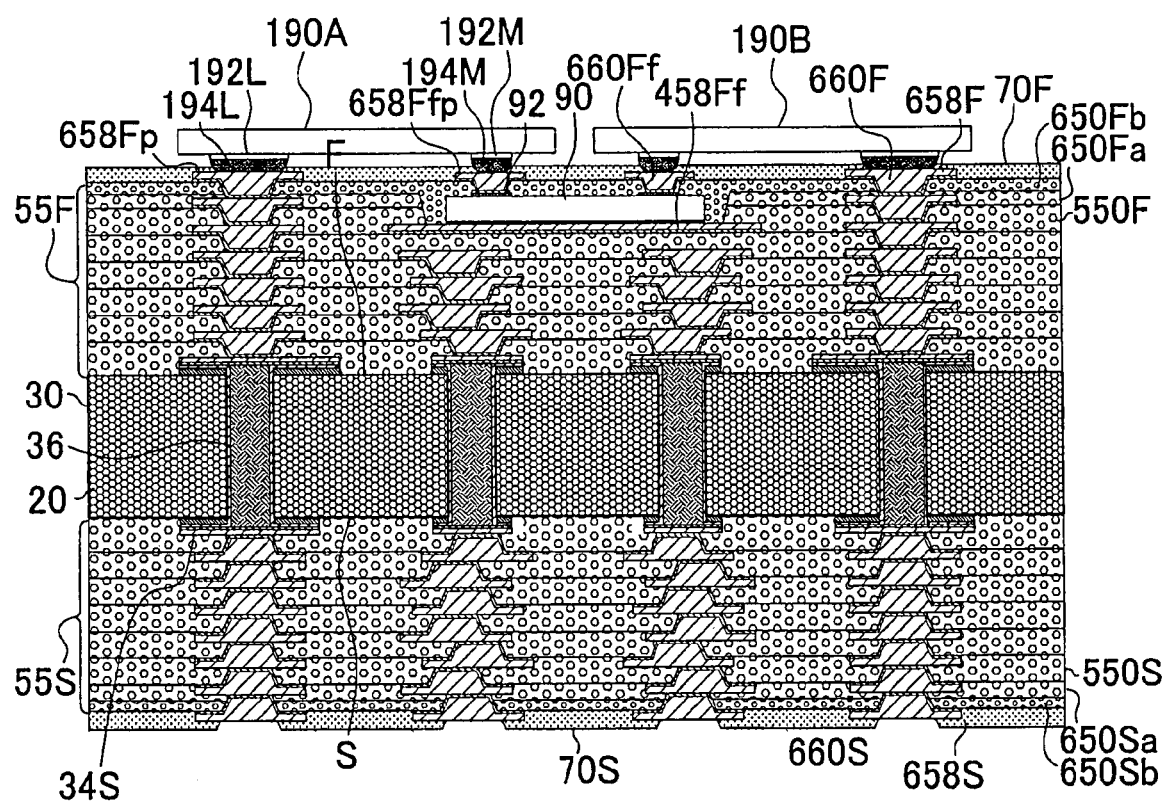
FIG. 10 illustrates a cross-sectional view of an exemplary application of the substrate with the built-in electronic component according to the first embodiment.

The third conductor pad (658Fp) and the fourth conductor pad (658Ffp) are arranged on the outermost resin insulating layer in a respectively staggered pattern. FIG. 9(A) depicts a state in which the electronic components (190A, 190B) have been mounted. A large diameter-side pad (192L) of the electronic component (190A) is connected to the third conductor pad (658Fp) via a solder bump (194L), while a small diameter-side pad (192M) is connected to the fourth conductor pad (658Ffp) via a solder bump (194M). In addition, in FIG. 10, solder-resist layers (70F, 70S) are formed on the substrate with the built-in electronic component shown in FIG. 9(A).

The substrate with the built-in electronic component according to the first embodiment includes the second via conductor (660F) penetrating through the outermost resin insulating layer (650F) and reaching the lower layer second conductor wiring layer (558F); and the third via conductor (660Ff) penetrating through the fourth resin insulating layer (650Fb) and reaching the pad 92 of the electronic component 90. Specifically, the third via conductor (660Ff) connected to the pad of the electronic component penetrates through only the fourth resin insulating layer (650Fb) of the outermost resin insulating layer (650F) and, because the resin insulating layer through which the via conductor passes is thin, the fourth conductor pad (658Ffp) can be formed on the built-in electronic component with a fine pitch.

A content amount of inorganic filler in the fourth resin insulating layer (650Fb) is greater than the content amount of inorganic filler in the third resin insulating layer (650Fa). Therefore, a thermal expansion rate is close to that of the electronic component 90, which is configured from silicon, and cracks are unlikely to develop at a boundary surface between the electronic component and the fourth resin insulating layer.

Method of Manufacturing Substrate with Built-in Electronic Component according to First Embodiment A method of manufacturing the substrate with the built-in electronic component 10 according to the first embodiment is illustrated in FIGS. 2 to 8.

Figure 2A:
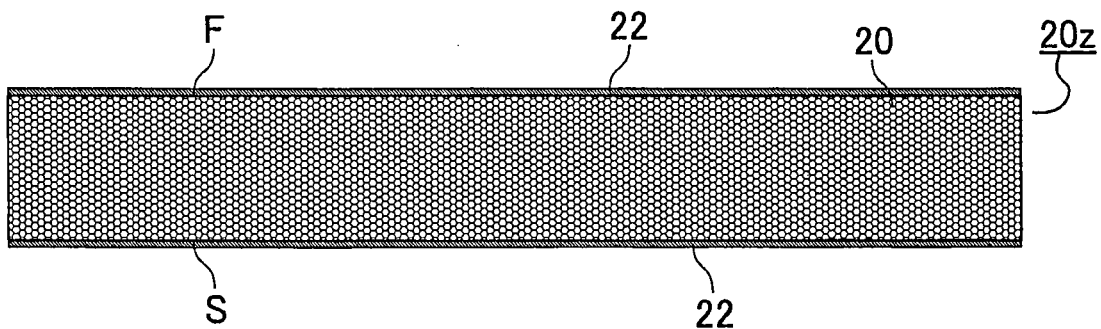
FIG. 2(A)-2(D) illustrate a step diagram of a method of manufacturing the substrate with the built-in electronic component according to the first embodiment.
Figure 2B:
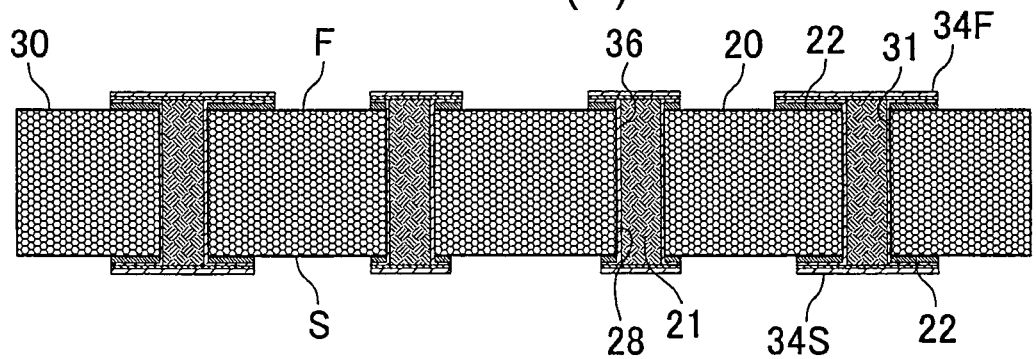

(1) The insulating substrate 20 having the first surface (F) and the second surface (S) on the side opposite the first surface and a copper-clad laminate (20z) configured by copper foil 22 laminated on both surfaces thereof are prepared (FIG. 2(A)). ELC4785TH-G, manufactured by Sumitomo Bakelite Corporation, can be used as the copper-clad laminate (20z).

The insulating layer of the insulating substrate 20 is formed with resin and a reinforcement material, examples of which reinforcement material may include glass fiber cloth, aramid fiber, and glass fiber. Examples of the resin may include epoxy resin and BT (bismaleimide triazine) resin.

(2) The through-hole conductor 36, the first surface-side conductor wiring layer (34F), and the second surface-side conductor wiring layer (34S) are formed on the insulating substrate 20 using a method described in U.S. Pat. No. 7,786,390, completing the core substrate 30 (FIG. 2(B)).

Figure 2C:
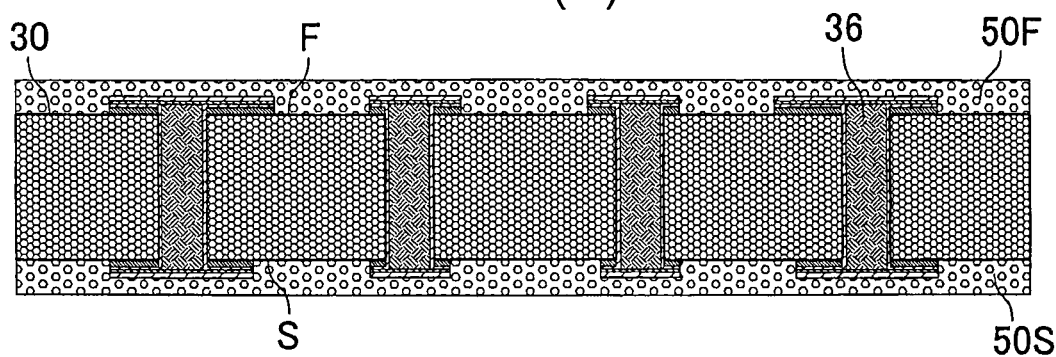

(3) A resin insulating layer is laminated, the resin insulating layer configured by impregnating inorganic fibers on the first surface and the second surface of the core substrate 30 with resin containing inorganic filler, then the resin insulating layers (50F, 50S) are formed by hot-pressing (FIG. 2(C)). Herein, the resin insulating layer (50S) can also employ an insulating layer configured by inorganic filler and resin.

Figure 2D:
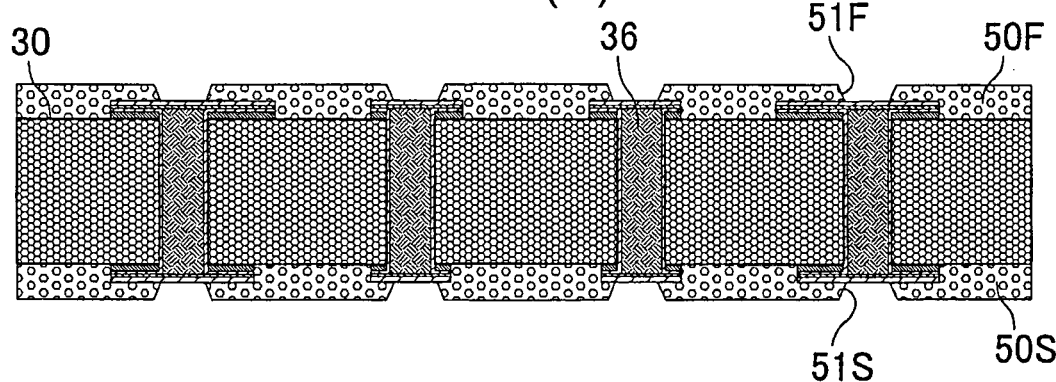

(4) Using a $CO_2$ gas laser, a via conductor opening (51F) is formed on the resin insulating layer (50F) and a via conductor opening (51S) is formed on the resin insulating layer (50S) (FIG. 2(D)).

Figure 3A:
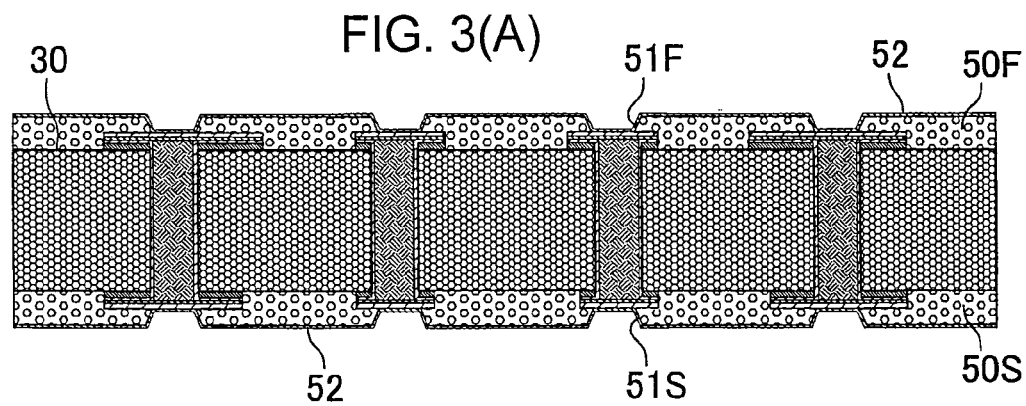
FIG. 3(A)-3(D) illustrate a step diagram of the method of manufacturing the substrate with the built-in electronic component according to the first embodiment.

(5) An electroless copper plating layer 52 is formed on a front surface of the resin insulating layers and on inner walls of the openings (51F) and (51S) (FIG. 3(A)).

Figure 3B:
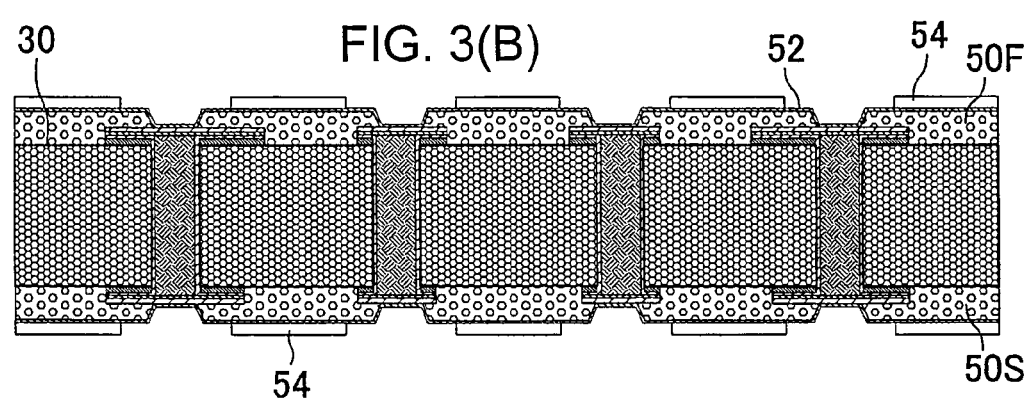

(6) A plating resist 54 is formed on the electroless copper plating layer 52 (FIG. 3(B)).

Figure 3C:
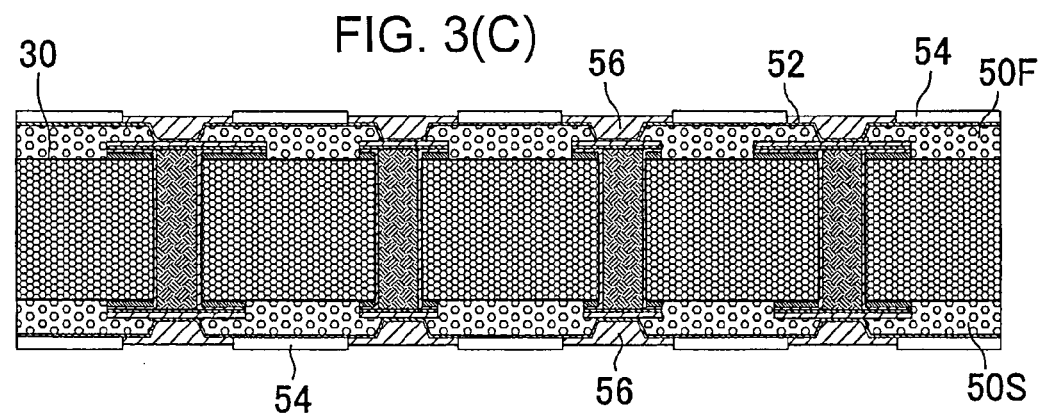

(7) A copper electroplating layer 56 is formed on the electroless copper plating layer 52 exposed from the plating resist 54 (FIG. 3(C)).

(8) The plating resist 54 is removed. The electroless copper plating layer 52 between the copper electroplating layers 56 is removed by etching, thereby forming the conductor wiring layers (58F, 58S) and the via conductors (60F, 60S) (FIG. 3(D)).

Figure 3D:
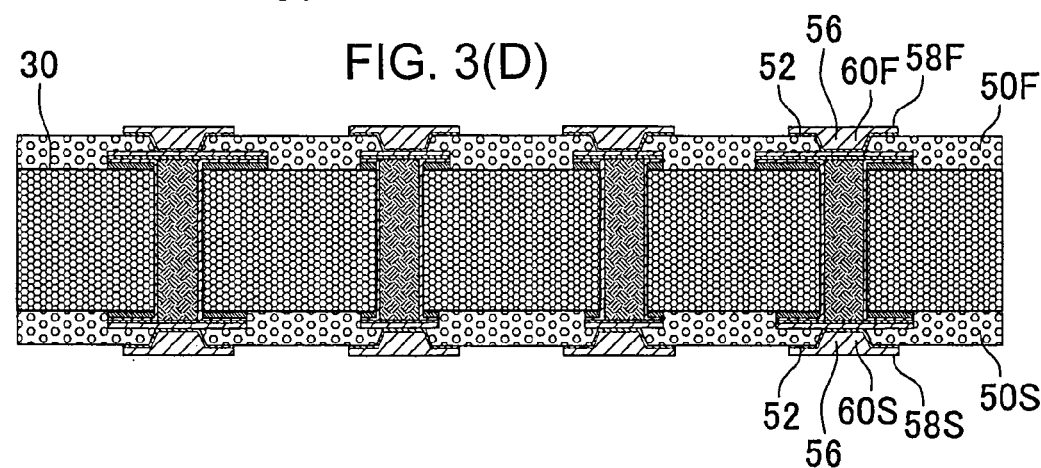
Figure 4:
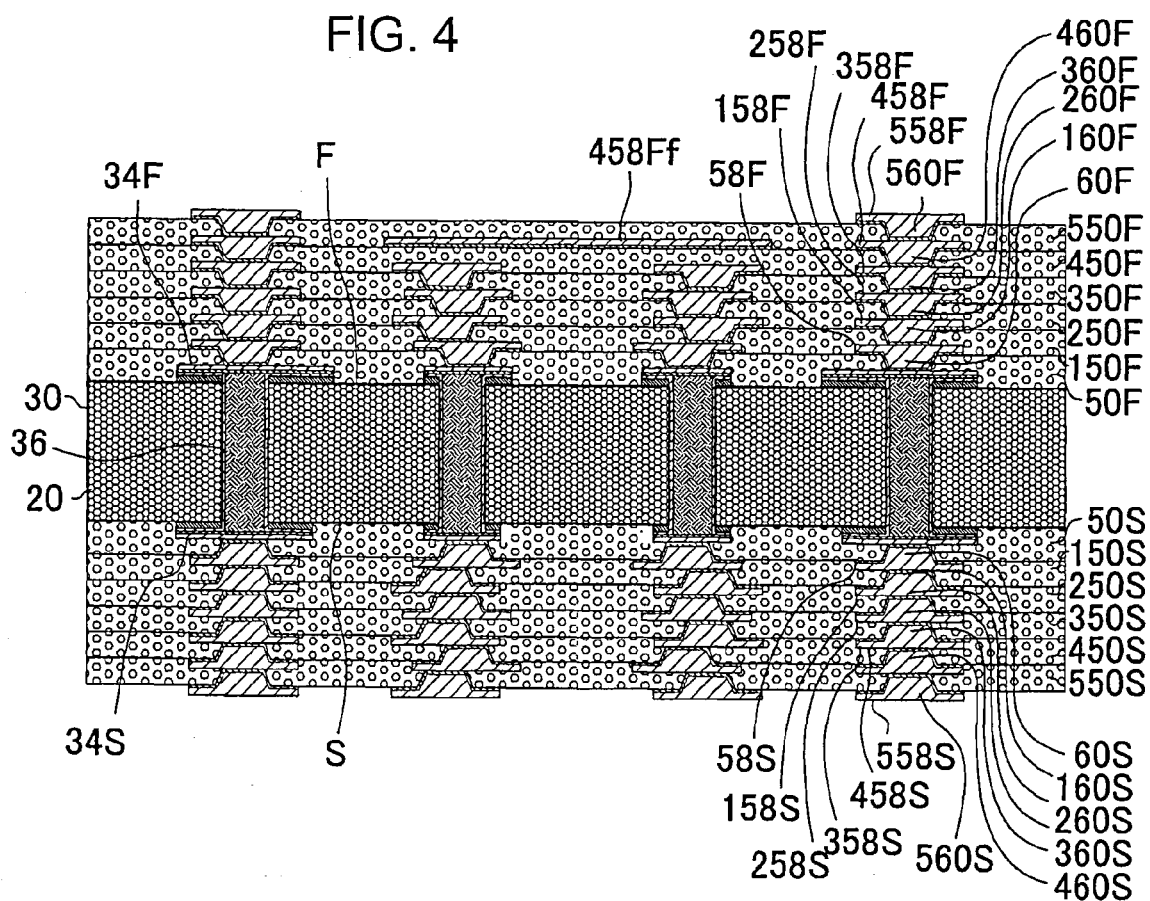
FIG. 4 illustrates a step diagram of the method of manufacturing the substrate with the built-in electronic component according to the first embodiment.

(9) The steps of FIG. 2 (C) and FIG. 3(D) are repeated five more times, forming on the first surface (F) side of the core substrate 30 the resin insulating layers (150F, 250F, 350F), the first resin insulating layer (450F), the second resin insulating layer (550F), the conductor wiring layers (158F, 258F, 358F), the first conductor wiring layer (458F), the second conductor wiring layer (558F), the via conductors (160F, 260F, 360F, 460F), and the first via conductor (560F). In addition, the resin insulating layers (150S, 250S, 350S), the first resin insulating layer (450S), the second resin insulating layer (550S), the conductor wiring layers (158S, 258S, 358S), the first conductor wiring layer (458S), the second conductor wiring layer (558S), the via conductors (160S, 260S, 360S, 460S), and the first via conductor (560S) are formed on the second surface (S) side of the core substrate 30 (FIG. 4). Herein, the support conductor wiring layer (458Ff), on which the electronic component is placed, is formed simultaneously with the first conductor wiring layer (458F) on the first resin insulating layer (450F) below the second resin insulating layer (550F).

Figure 5A:
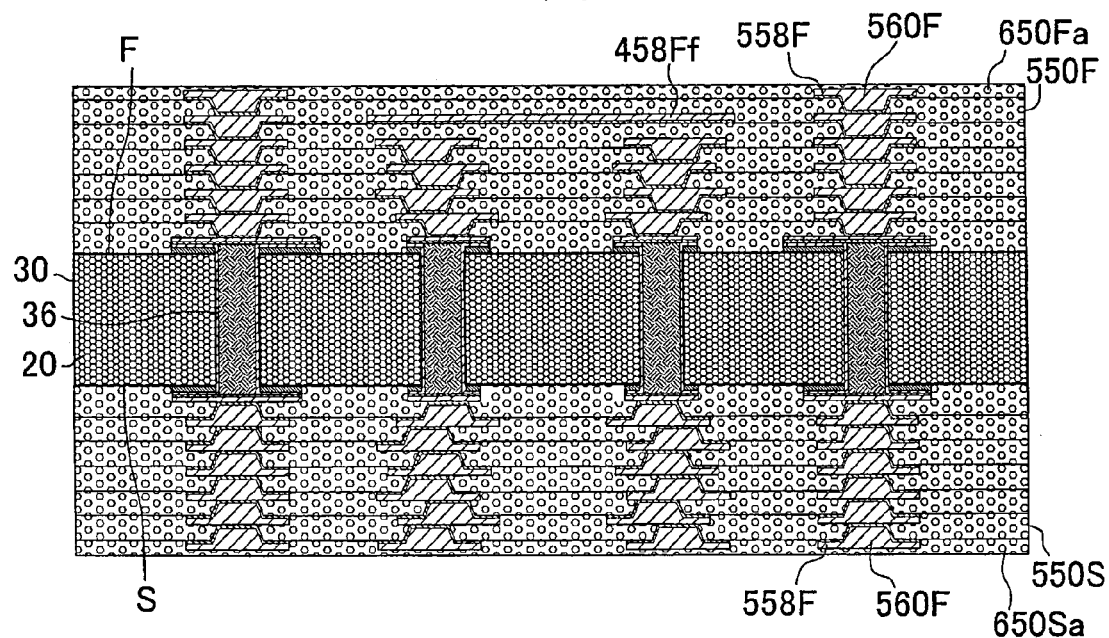
FIG. 5(A)-5(B) illustrate a step diagram of the method of manufacturing the substrate with the built-in electronic component according to the first embodiment.

(10) The 10 μm inner resin insulating layers (third resin insulating layers) (650Fa, 650Sa), which constitute a portion of the outermost resin insulating layers, are laminated on top of the second resin insulating layers (550F, 550S) and the second conductor wiring layers (558F, 558S), and are left in a semi-cured state (FIG. 5(A)).

Figure 5B:
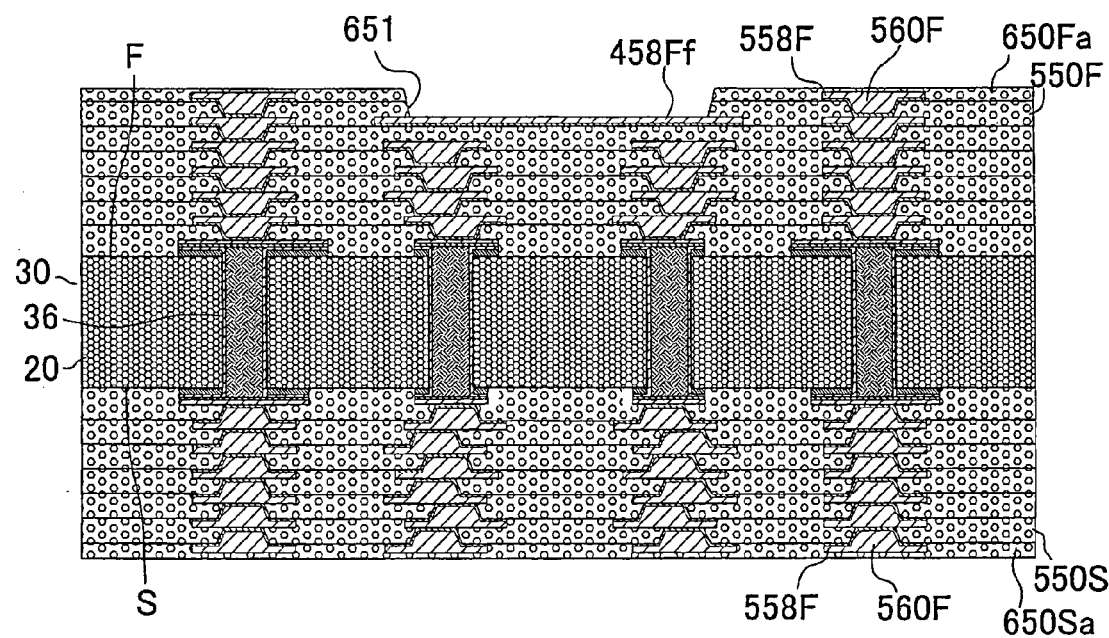

(11) Using a laser, a slit is formed in the third resin insulating layer (650Fa) and the second resin insulating layer (550F), the slit reaching the support conductor wiring layer (458Ff), then the sliced third resin insulating layer (650Fa) and second resin insulating layer (550F) site are removed, forming the cavity 651 (FIG. 5(B)). A taper is provided to the cavity 651. The third resin insulating layer (650Fa) is in a semi-cured state, and therefore has excellent formability with laser processing.

Figure 6A:
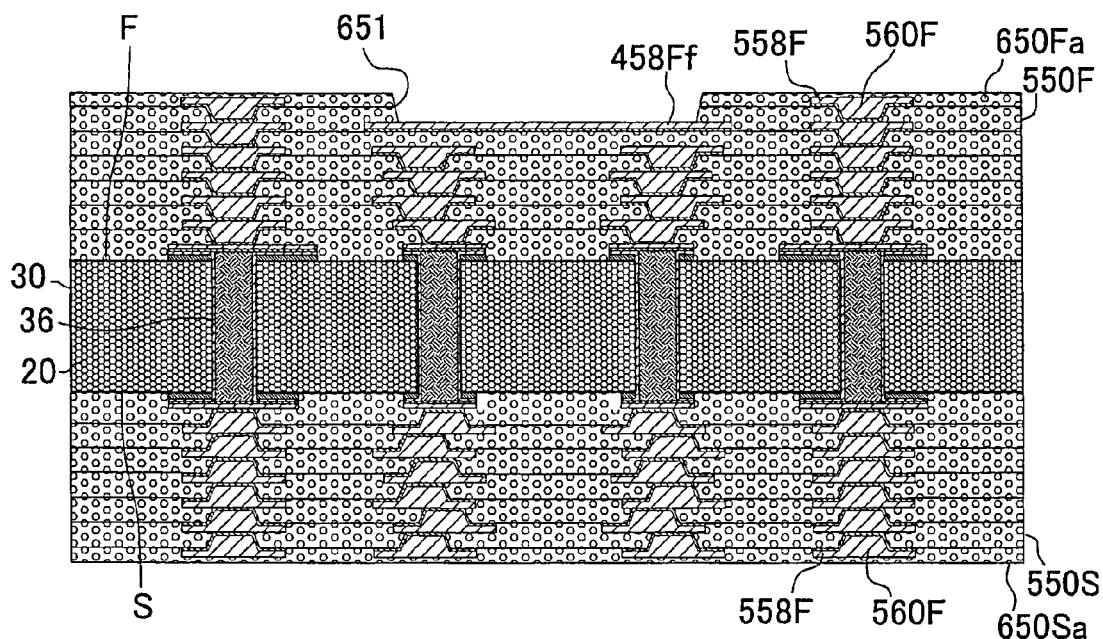
FIG. 6(A)-6(B) illustrate a step diagram of the method of manufacturing the substrate with the built-in electronic component according to the first embodiment.

(12) A de-smearing process is performed, and debris on the support conductor wiring layer (458Ff) from the laser cutting is removed (FIG. 6(A)). At this point, the de-smearing process is performed in a state where the third resin insulating layer (650Fa) is coated on the second conductor wiring layer (558F), which is on the second resin insulating layer (550F). Therefore, no gap can be formed between the second resin insulating layer (550F) and the second conductor wiring layer (558F), and reliability of the second conductor wiring layer (558F) is not reduced. A roughening process can also be performed on the support conductor wiring layer (458Ff).

Figure 6B:
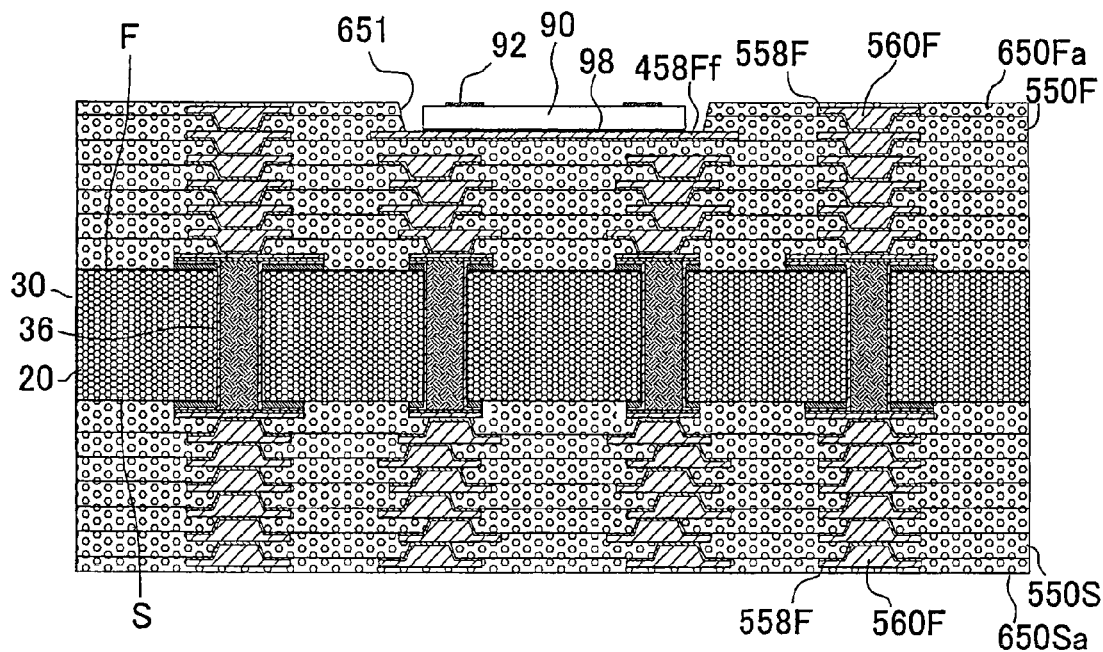
Figure 7A:
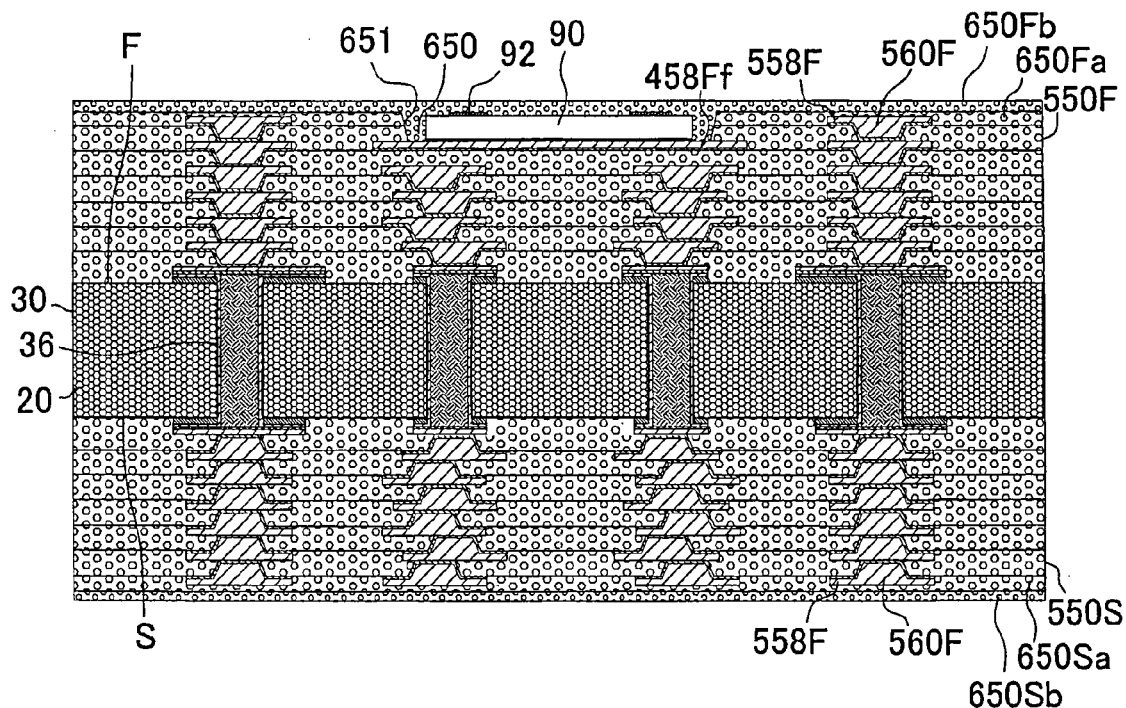
FIG. 7(A)-7(B) illustrate a step diagram of the method of manufacturing the substrate with the built-in electronic component according to the first embodiment.
Figure 7B:
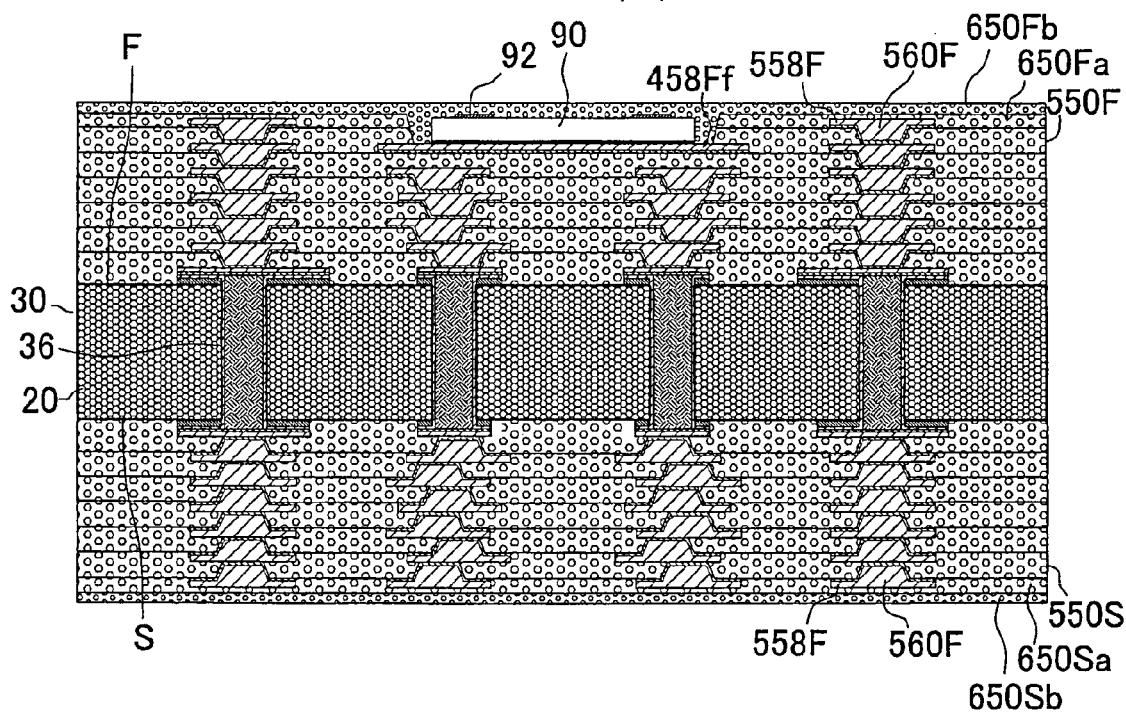

(13) The electronic component 90 is arranged on top of the support conductor wiring layer (458Ff) with the adhesive 98 interposed therebetween (FIG. 6(B)).

(14) the 20 μm fourth resin insulating layer (650Fb) is laminated on the electronic component 90 and the third resin insulating layer (650Fa) on the first surface side, and a resin 650 originating with the fourth resin insulating layer is filled in between the cavity 651 interior and the electronic component 90. At this point, because the taper is provided to the cavity, the resin is readily filled. The 20 μm fourth resin insulating layer (650Sb) is laminated on the third resin insulating layer (650Sa) on the second surface side (FIG. 7(A)). Herein, the fourth resin insulating layers (650Fb, 650Sb) are thicker than the third resin insulating layers (650Fa, 650Sa), and have a greater amount of inorganic filler. Thereafter, the fourth resin insulating layers (650Fb, 650Sb) are left in a semi-cured state (FIG. 7(B)).

(15) A third opening (651F) penetrating through the outermost resin insulating layer (third resin insulating layer and fourth resin insulating layer) (650F) to reach the second conductor wiring layer (558F) and a fourth opening (751Ff) penetrating through the fourth resin insulating layer (650Fb) to reach the electronic component pad 92 are formed on the first surface side using a laser. A third opening (651S) penetrating through the outermost resin insulating layer (third resin insulating layer and fourth resin insulating layer) (650S) to reach the second conductor wiring layer (558S) is formed on the second surface side using a laser (FIG. 8(A)). The fourth resin insulating layers (650Fb, 650Sb) are in a semi-cured state, and therefore have excellent formability with laser processing.

Figure 8A:
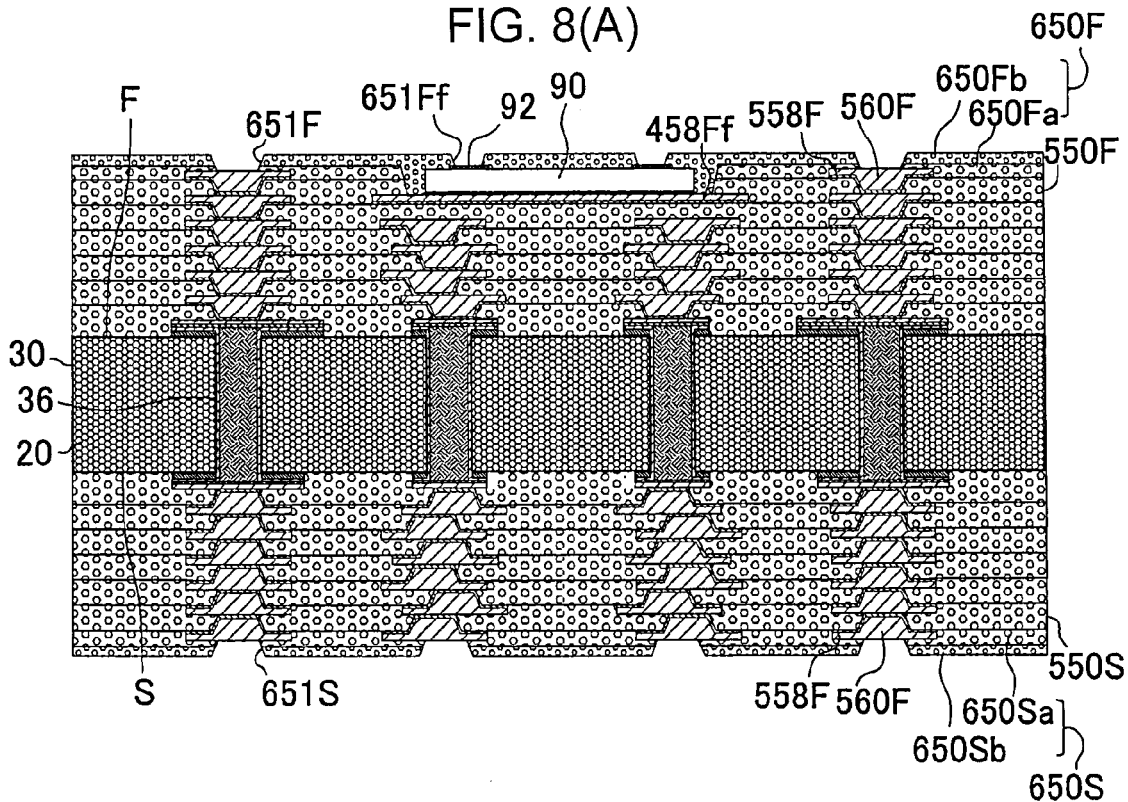
FIG. 8(A)-8(B) illustrate a step diagram of the method of manufacturing the substrate with the built-in electronic component according to the first embodiment.
Figure 8B:
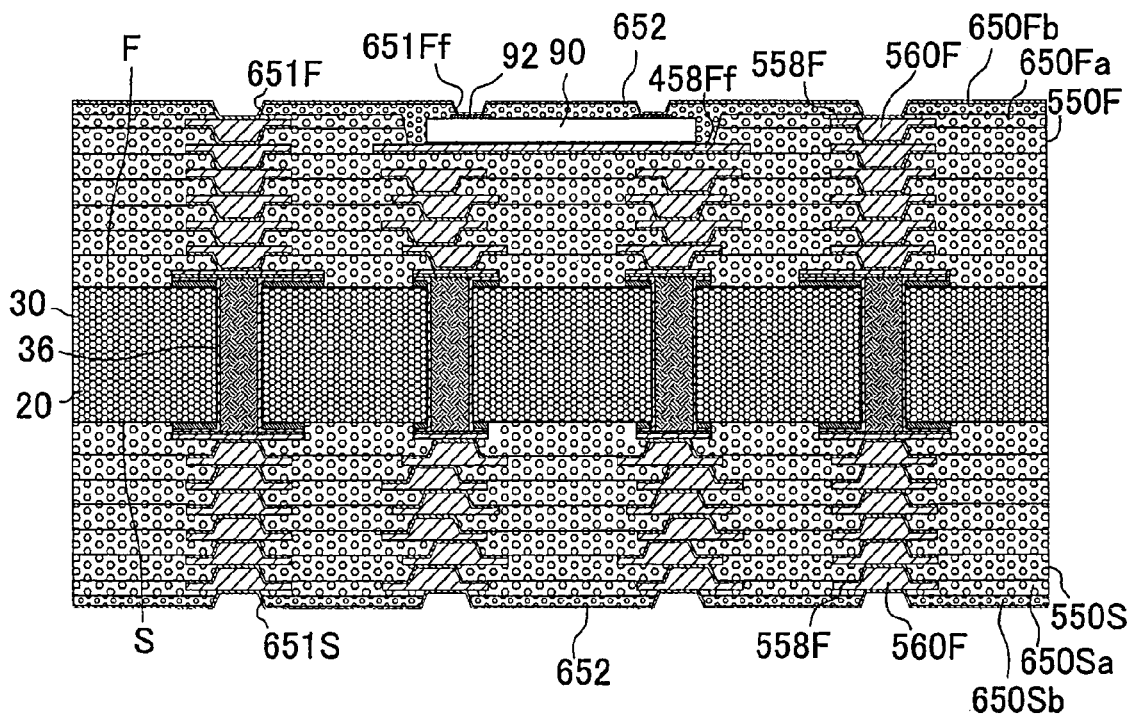

(16) An electroless copper plating layer 652 is formed on the fourth resin insulating layers (650Fb, 650Sb), and on inner walls of the third openings (651F, 651S) and second opening (651Ff) (FIG. 8(B)).

(17) The steps of FIG. 3(B) to FIG. 3(D) are repeated again, forming on the outermost resin insulating layer (650F) on the first surface side the second via conductor (660F), the third via conductor (660Ff), and the third conductor wiring layer (658F). The second via conductor (660S) and the third conductor wiring layer (658S) are formed on the outermost resin insulating layer (650S) on the second surface side (FIG. 1). This completes the substrate with the built-in electronic component.

Moreover, a solder-resist layer can be formed on the outermost resin insulating layer. In addition, surface treatment can also be performed on the third conductor wiring layers (658F, 658S). The surface treatment may be formed by nickel-gold (Ni/Au), Sn plating, a nickel-palladium-gold layer (Ni/Pd/Au), Pd/Ag plating, or an OSP (Organic Solderability Preservative) film.

(18) Electronic components (190A, 190B) are mounted to the substrate with the built-in electronic component on the third conductor pad (658Fp) and fourth conductor pad (658Ffp), which are formed by the first surface-side conductor wiring layer (650F). The large diameter-side pad (192L) of the electronic component (190A) is connected to the third conductor pad (658Fp) via the solder bump (194L), while the small diameter-side pad (192M) is connected to the fourth conductor pad (658Ffp) via the solder bump (194M).

In the manufacturing method according to the first embodiment, the de-smearing process is performed in a state where the third resin insulating layer (650Fa) is coated on the second conductor wiring layer (558F), which is on the second resin insulating layer (550F). Therefore, no gap can be formed between the second resin insulating layer (550F) and the second conductor wiring layer (558F), and reliability of the second conductor wiring layer (558F) is not reduced.

Moreover, the second via opening (651F) penetrating through the outermost resin insulating layer (650F) to reach the second conductor wiring layer (558F) and the third via opening (651H) penetrating through the fourth resin insulating layer (650Fb) to reach the pad 90 of the electronic component 90 are formed, and the second via conductor (650F) is formed in the second via opening while the third via conductor (650Ff) is formed in the third via opening. Specifically, the third via conductor connected to the pad of the electronic component penetrates through only the fourth resin insulating layer of the outermost resin insulating layer and, because the resin insulating layer through which the via conductor passes is thin, the pad (fourth conductor pad) can be formed on the built-in electronic component with a fine pitch.

Second Embodiment

Figure 11A:
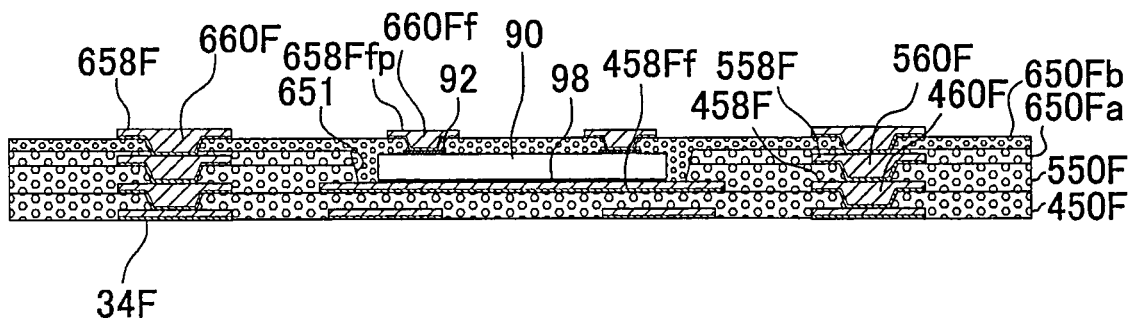
FIG. 11(A) is a cross-sectional view of a substrate with a built-in electronic component according to a second embodiment.
Figure 11B:
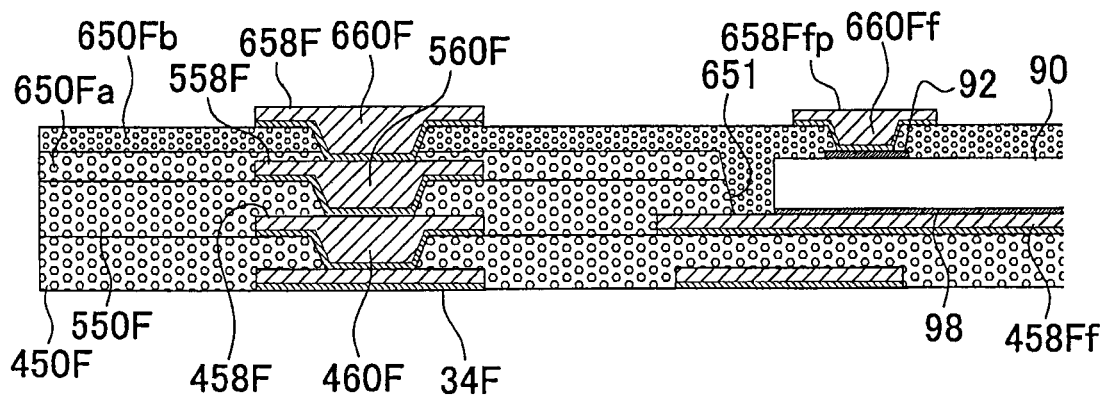
FIG. 11(B) is a partial expanded view of FIG. 11(A)

FIG. 11(A) depicts a substrate with a built-in electronic component according to a second embodiment. FIG. 11(B) is a partial expanded view of FIG. 11(A).

The substrate with the built-in electronic component according to the second embodiment is a build-up-style laminated substrate that does not include a core substrate having the three-layer structure configured by the first resin insulating layer (450F), the second resin insulating layer (550F), and the outermost resin insulating layer (650F).

The outermost resin insulating layer (650F) has a two-layer structure that includes the third resin insulating layer (650Fa) and the fourth resin insulating layer (650Fb). The cavity 651 is formed in the second resin insulating layer (550F) and the third resin insulating layer (650Fa), and the electronic component 90 is accommodated in the cavity. The support conductor wiring layer (458Ff) supporting the electronic component is formed on the first resin insulating layer (450F) below the second resin insulating layer (550F). The electronic component 90 is arranged on top of the support conductor wiring layer (458Ff) with the adhesive 98 interposed therebetween. The fourth resin insulating layer (650Fb) is coated on top of the electronic component 90, the terminal (pad) 92 of the electronic component 90 and the fourth conductor pad (658Ffp) on the fourth resin insulating layer (650Fb) are connected by the third via conductor (660Ff), which runs through the fourth resin insulating layer (650Fb). The lower layer second conductor wiring layer (558F) and the outermost third conductor wiring layer (658F) are connected by the second via conductor (660F), which runs through the outermost resin insulating layer (650F). The first conductor wiring layer (458F) is formed on the first resin insulating layer (450F), and is connected to the surface layer pad (34F) via the via conductor (460F).

Modification of Second Embodiment

Figure 11C:
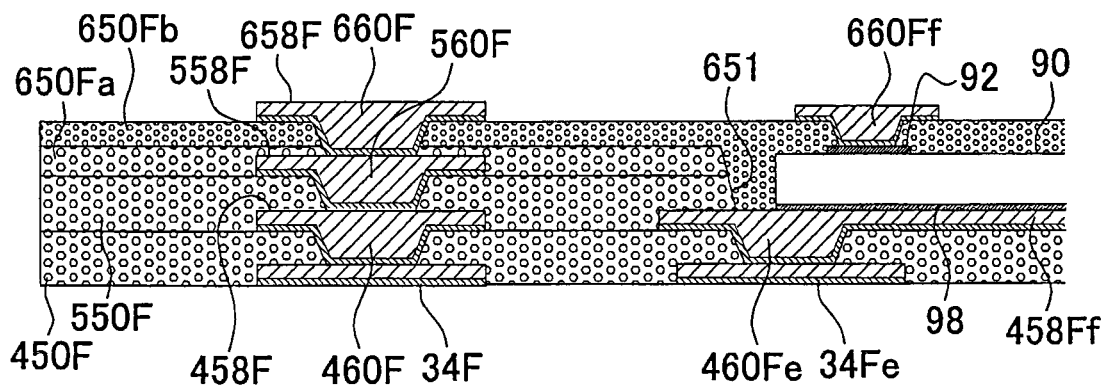
FIG. 11(C) is a cross-sectional view of a modification of the substrate with the built-in electronic component according to the second embodiment.

FIG. 11(C) depicts a substrate with a built-in electronic component according to a modification of the second embodiment. In the substrate with the built-in electronic component according to the modification of the second embodiment, the support conductor wiring layer (458Ff) and a grounding pad (34Fe) are connected via a grounding via conductor (460Fe). In the modification of the second embodiment, a conductive material is used for the adhesive 98.

Low reliability of a wiring pattern on a resin insulating layer in which is formed a cavity accommodating an electronic component is a problem. A cause of this may be that during a de-smearing process for removing laser debris after cutting away the resin insulating layer with a laser, a surface of the resin insulating layer in which the cavity is formed is excavated, a gap is formed between the resin insulating layer and a conductor pattern, and reliability of the conductor pattern is reduced.

A substrate with a built-in electronic component according to an embodiment of the present invention and a method for manufacturing a substrate with a built-in electronic component according to an embodiment of the present invention provide high reliability and finely pitched pads which can be formed on the built-in electronic component.

A manufacturing method of a substrate with a built-in electronic component according to an embodiment of the present invention includes: forming on a first resin insulating layer a first conductor wiring layer that includes a first conductor pad and a support conductor wiring layer formed to position an electronic component; laminating a second resin insulating layer on top of the first resin insulating layer and the first conductor wiring layer; forming a first via conductor penetrating through the second resin insulating layer to reach the first conductor pad; forming a second conductor wiring layer on the second resin insulating layer such that the second conduct wiring layer includes a second conductor pad connected to the first via conductor; laminating a third resin insulating layer on top of the second resin insulating layer and the second conductor wiring layer; forming, with a laser, a cavity penetrating through the third resin insulating layer and the second resin insulating layer to expose a portion of the support conductor wiring layer; applying a de-smearing process to the cavity; positioning the electronic component on the support conductor wiring layer; laminating a fourth resin insulating layer on top of the third resin insulating layer and the electronic component; forming a second via opening, penetrating through the third resin insulating layer and the fourth resin insulating layer to reach the second conductor pad, and a third via opening, penetrating through the fourth resin insulating layer to reach the pad of the electronic component; and forming a second via conductor in the second via opening and a third via conductor in the third via opening using plating, as well as forming a third conductor pad connected to the second via conductor and a fourth conductor pad connected to the third via conductor on top of the fourth resin insulating layer.

A substrate with a built-in electronic component according to an embodiment of the present invention includes: a first resin insulating layer; a first conductor wiring layer that includes a first conductor pad formed on the first resin insulating layer; a second resin insulating layer laminated on top of the first resin insulating layer and the first conductor wiring layer; a second conductor wiring layer that includes a second conductor pad formed on the second resin insulating layer; a first via conductor penetrating through the second resin insulating layer and connecting the first conductor pad and the second conductor pad; a third resin insulating layer laminated on top of the second resin insulating layer and the second conductor wiring layer; a cavity for installing an electronic component, the cavity being formed penetrating through the second resin insulating layer and the third resin insulating layer; an electronic component having a terminal installed in the cavity; a fourth resin insulating layer laminated on top of the third resin insulating layer and the electronic component; a third conductor wiring layer including a third conductor pad and a fourth conductor pad formed on top of the fourth resin insulating layer; a second via conductor connecting the second conductor pad and the third conductor pad; and a third via conductor connecting the terminal of the electronic component and the fourth conductor pad. In addition, the second via conductor runs through the third resin insulating layer and the fourth resin insulating layer and is filled by filled plating, while the third via conductor runs through the fourth resin insulating layer and is filled by filled plating.

In a method for manufacturing a substrate with a built-in electronic component, the third resin insulating layer is laminated on top of the second resin insulating layer and the second conductor wiring layer; the cavity penetrating through the third resin insulating layer and the second resin insulating layer to expose a portion of the support conductor wiring layer is formed using a laser; and the de-smearing process is applied to the cavity. Specifically, the de-smearing process is performed in a state where the third resin insulating layer is coated on the second conductor wiring layer, which is on top of the second resin insulating layer, and therefore no gap can be formed between the second resin insulating layer and the second conductor wiring layer, and reliability of the second conductor wiring layer is not reduced. Moreover, the second via opening, penetrating through the third resin insulating layer and the fourth resin insulating layer to reach the second conductor wiring layer, and the third via opening, penetrating through the fourth resin insulating layer to reach the pad of the electronic component, are formed and the second via conductor is formed in the second via opening while the third via conductor is formed in the third via opening. Specifically, the third via conductor connected to the pad of the electronic component penetrates through only the fourth resin insulating layer and, because the resin insulating layer through which the via conductor passes is thin, the pad (fourth conductor pad) can be formed on the built-in electronic component with a fine pitch.

A substrate with a built-in electronic component according to an embodiment of the present invention includes the second via conductor, penetrating through the fourth resin insulating layer and the third resin insulating layer to reach the second conductor wiring layer, and the third via conductor, penetrating through the fourth resin insulating layer to reach the pad of the electronic component. Specifically, the third via conductor connected to the pad of the electronic component penetrates through only the fourth resin insulating layer and, because the resin insulating layer through which the via conductor passes is thin, the pad (fourth conductor pad) can be formed on the built-in electronic component with a fine pitch.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate with a built-in electronic component, comprising:
    a plurality of resin insulating layers comprising a first resin insulating layer, a second resin insulating layer laminated on the first resin insulating layer, a third resin insulating layer laminated on the second resin insulating layer, and a fourth resin insulating layer laminated on the third resin insulating layer;
    a plurality of conductor layers comprising a first conductor wiring layer formed on the first resin insulating layer and comprising a first conductor pad, a second conductor wiring layer formed on the second resin insulating layer and comprising a second conductor pad, and a third conductor wiring layer formed on the fourth resin insulating layer and comprising a third conductor pad and a fourth conductor pad;
    a plurality of via conductors including a first via conductor formed through the second resin insulating layer and connecting the first conductor pad and the second conductor pad, a second via conductor formed through the third and fourth resin insulating layers and connecting the second conductor pad and the third conductor pad, and a third via conductor formed through the fourth resin insulating layer and connected to the fourth conductor pad; and
    an electronic component having a terminal and positioned a cavity formed through the second resin insulating layer and the third resin insulating layer such that the third via conductor is connecting the terminal of the electronic component and the fourth conductor pad formed on the fourth resin insulating layer,
    wherein the second via conductor comprises filled plating filling an opening portion formed through the third and fourth resin insulating layers, and the third via conductor comprises filled plating filling an opening portion formed through the fourth resin insulating layer.

2. A substrate with a built-in electronic component according to claim 1, wherein the first conductor wiring layer includes a support conductive wiring layer formed on the first resin insulating layer such that the electronic component is positioned on the support conductive wiring layer.

3. A substrate with a built-in electronic component according to claim 1, wherein the cavity is formed through the second resin insulating layer and the third resin insulating layer such that the cavity is tapering from the third resin insulating layer toward the second resin insulating layer.

4. A substrate with a built-in electronic component according to claim 3, wherein the fourth resin insulating layer includes a resin portion filling a space formed in the cavity having the electronic component.

5. A substrate with a built-in electronic component according to claim 1, wherein the fourth resin insulating layer has a thickness which is greater than a thickness of the third resin insulating layer.

6. A substrate with a built-in electronic component according to claim 1, wherein the first conductor wiring layer includes a support conductive wiring layer connected to a ground line and formed on the first resin insulating layer such that the electronic component is positioned on the support conductive wiring layer.

7. A substrate with a built-in electronic component according to claim 1, wherein the first conductor wiring layer includes a support conductive wiring layer formed on the first resin insulating layer such that the electronic component is positioned on the support conductive wiring layer and the support conductive wiring layer has an area size greater than an area size of a bottom portion of the cavity.

8. A substrate with a built-in electronic component according to claim 1, wherein the first conductor wiring layer includes a support conductive wiring layer formed on the first resin insulating layer such that the electronic component is mounted on the support conductive wiring layer via an adhesive agent.

9. A substrate with a built-in electronic component according to claim 1, wherein the second resin insulating layer and the third resin insulating layer form a thickness such that the cavity formed through the second resin insulating layer and the third resin insulating layer has a depth which is equal to a thickness of the electronic component.

10. A substrate with a built-in electronic component according to claim 1, wherein the electronic component has a rewiring layer.

11. A substrate with a built-in electronic component according to claim 1, wherein the third resin insulating layer includes inorganic filler, and the fourth resin insulating layer includes inorganic filler in an amount which is greater than an amount of the inorganic filler in the third resin insulating layer.

12. A substrate with a built-in electronic component according to claim 2, wherein the cavity is formed through the second resin insulating layer and the third resin insulating layer such that the cavity is tapering from the third resin insulating layer toward the second resin insulating layer.

13. A substrate with a built-in electronic component according to claim 2, wherein the fourth resin insulating layer includes a resin portion filling a space formed in the cavity having the electronic component.

14. A substrate with a built-in electronic component according to claim 2, wherein the fourth resin insulating layer has a thickness which is greater than a thickness of the third resin insulating layer.

15. A substrate with a built-in electronic component according to claim 1, wherein the fourth resin insulating layer includes a resin portion filling a space formed in the cavity having the electronic component.

16. A method for manufacturing a substrate with a built-in electronic component, comprising:
    forming a first conductor wiring layer on a first resin insulating layer such that the first conductor wiring layer includes a first conductor pad and a support conductor wiring layer configured to position an electronic component;
    laminating a second resin insulating layer on the first resin insulating layer and the first conductor wiring layer;

forming a first via conductor through the second resin insulating layer such that the first via conductor reaches the first conductor pad;

forming a second conductor wiring layer on the second resin insulating layer such that the second conductor wiring layer includes a second conductor pad connected to the first via conductor on the second resin insulating layer;

laminating a third resin insulating layer on the second resin insulating layer and the second conductor wiring layer;

irradiating laser upon the third resin insulating layer such that a cavity is formed through the third resin insulating layer and the second resin insulating layer and exposes a portion of the support conductor wiring layer;

positioning the electronic component on the portion of the support conductor wiring layer in the cavity;

laminating a fourth resin insulating layer on the third resin insulating layer and the electronic component;

forming a second via opening through the third resin insulating layer and the fourth resin insulating layer such that the second via opening reaches the second conductor pad;

forming a third via opening through the fourth resin insulating layer such that the third via opening reaches a terminal of the electronic component; and plating the second via opening and the third via opening such that a second via conductor comprising filled plating is formed in the second via opening and a third via conductor comprising filled plating is formed in the third via opening.

17. A method for manufacturing a substrate with a built-in electronic component according to claim 16, further comprising:

forming a third conductor pad on the fourth resin insulating layer such that the third conductor pad is connected to the second via conductor; and forming a fourth conductor pad on the fourth resin insulating layer such that the fourth conductor pad is connected to the third via conductor.

18. A method for manufacturing a substrate with a built-in electronic component according to claim 16, further comprising:

applying de-smearing to the cavity; and forming a roughened surface on the portion of the support conductor wiring layer in the cavity after the applying of the de-smearing to the cavity.

19. A method for manufacturing a substrate with a built-in electronic component according to claim 16, further comprising:

forming the third resin insulating layer having a semi-cured state after the laminating of the third resin insulating layer on the second resin insulating layer and the second conductor wiring layer.

20. A method for manufacturing a substrate with a built-in electronic component according to claim 16, further comprising:

forming the fourth resin insulating layer having a semi-cured state after the laminating of the fourth resin insulating layer on the third resin insulating layer.

* * * * *